(12) United States Patent
Holcomb

(10) Patent No.: US 8,810,608 B2
(45) Date of Patent: Aug. 19, 2014

(54) DEVICE FOR DISPLAYING A WAVEFORM WITH VARIABLE PERSISTENCE AND METHOD OF PROVIDING THE SAME

(75) Inventor: Matthew S. Holcomb, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 762 days.

(21) Appl. No.: 12/830,645

(22) Filed: Jul. 6, 2010

(65) Prior Publication Data

US 2012/0007874 A1    Jan. 12, 2012

(51) Int. Cl.
*G09G 5/10* (2006.01)
*G06F 3/038* (2013.01)
*G09G 5/00* (2006.01)
*G09G 5/36* (2006.01)

(52) U.S. Cl.
USPC ............................. 345/690; 345/208; 345/556

(58) Field of Classification Search
None
See application file for complete search history.

(56) References Cited

U.S. PATENT DOCUMENTS

| | | | | |
|---|---|---|---|---|
| 4,829,293 | A | * | 5/1989 | Schlater ..................... 345/440.1 |
| 2005/0110796 | A1 | * | 5/2005 | Flowers et al. ............... 345/589 |
| 2007/0030260 | A1 | * | 2/2007 | Yano ............................ 345/204 |
| 2008/0246706 | A1 | * | 10/2008 | Russell et al. .................. 345/84 |

* cited by examiner

*Primary Examiner* — Maurice L McDowell, Jr.
*Assistant Examiner* — Donna J Ricks

(57) ABSTRACT

A device includes a memory storing a persistence bit for each of a plurality of pixels of a display device, the persistence bit having a first value when a corresponding pixel should be illuminated for displaying a persistent image, and having a second value when the corresponding pixel should not be illuminated for the persistent image; a pseudorandom pixel value generator which during each video frame receives a seed value and generates pseudorandom pixel values for the plurality of pixels, each pseudorandom pixel value being not greater than a specified variable persistence value; a frame value generator outputting a frame value for each video frame; and a match detector which, during each video frame, compares the frame value to the pseudorandom pixel values for the plurality of pixels, and for each pixel where the comparison indicates a match, makes the persistence bit for the corresponding pixel have the second value.

20 Claims, 6 Drawing Sheets

DEVICE FOR DISPLAYING A WAVEFORM WITH VARIABLE PERSISTENCE AND METHOD OF PROVIDING THE SAME

BACKGROUND

Many measurement instruments include a display device, and/or provide outputs for a display device, for displaying waveform images corresponding to the instrument's measurement of an input signal applied to the instrument. Examples of such instruments include oscilloscopes, logic analyzers and digital spectrum analyzers. In these instruments, waveform images are drawn onto a rasterized display device at the display device's video frame rate—for example, 60 frames per second.

The "persistence" of a waveform image describes the length of time that the waveform image continues to be displayed in whole or in part on the display device before it is erased. If the waveform image is erased one frame after it is drawn, then the waveform image has a minimum persistence (also sometimes referred to as non-persistence). At the other extreme, if the waveform image was never erased from the display device, then the waveform image would have infinite persistence. Between these two extremes lies a range of finite persistence for a displayed waveform image.

FIG. 1 illustrates an example oscilloscope 100 with a variable persistence. Oscilloscope 100 includes inputs 110 for receiving signals, a display device 120 for displaying one or more waveform images corresponding to the instrument's measurement of one or more input signals, and a control section 130 having a plurality of control inputs, including variable persistence control inputs 135 (e.g., rotatable knobs), one for each channel of the oscilloscope.

FIG. 2 shows a functional block diagram of portions of one example of a digital oscilloscope 200. Oscilloscope 200 includes probe 210, a vertical system 220, a trigger system 230, a horizontal system 240, an acquisition system 250, a digital display system 260, and a display device 270.

Often it is desirable to give a user of a measurement instrument one or more control inputs (e.g., variable persistence control inputs 135 in oscilloscope 100) for receiving a user input for controlling or adjusting the persistence of displayed waveform images. When the user selects a small persistence value (e.g., 0.5 seconds), then the waveform image remains displayed for only a short amount of time, providing a lively, responsive display. Longer persistence times allow the waveform images to linger on the display, allowing a user more time to analyze the waveform.

In existing instruments, this flexibility comes at a price in terms of memory requirements imposed on the instrument. The common approach to displaying waveforms for a variable amount of time on a display device in a digital oscilloscope is to keep track of how long each pixel of the waveform image has been displayed and to decrement this time to zero at a regular rate. One common implementation stores in memory a "time-left-on-screen" value for each pixel of the display device. For each video frame, this value is read from memory for each pixel. If the value is non-zero, then the pixel is displayed, the value is decremented, and the new value is written back into memory. This is repeated for every channel of the oscilloscope for which a persistent waveform image is displayed. This requires a high-speed multiple-bit decrementer for each channel. This also requires a read-modify-write memory operation for each pixel in each video frame. With a display device having a large number of pixels, this translates to a large amount of display memory with a high display memory bandwidth, resulting in relatively expensive display memory system.

It would be desirable to provide another solution for displaying a waveform with variable persistence in display device associated with a measurement instrument that could be less complex and less expensive.

SUMMARY

In an example embodiment, a device comprises: a memory configured to store a persistence bit for each of a plurality of pixels of a display device, the persistence bit having a first value when a corresponding pixel should be illuminated for displaying a persistent image, and having a second value when the corresponding pixel should not be illuminated for the persistent image; a pseudorandom pixel value generator configured to receive a seed value for each video frame of the display device and in response thereto to generate pseudorandom pixel values for the plurality of pixels during each video frame, each pseudorandom pixel value being not greater than a specified variable persistence value corresponding to a desired persistence of the persistent image; a frame value generator configured to output a frame value for each video frame of the display device, each frame value being not greater than the specified variable persistence value; and a match detector configured to compare the frame value to the pseudorandom pixel values for the plurality of pixels during each video frame, and for each pixel where the comparison indicates a match, to make the persistence bit for the corresponding pixel in the persistence display memory have the second value.

In another example embodiment, a method comprises: storing in a memory a persistence bit for each of a plurality of pixels of a display device, the persistence bit having a first value when a corresponding pixel should be illuminated for displaying a persistent image, and having a second value when the corresponding pixel should not be illuminated for the persistent image; establishing a variable persistence value representing a number of video frames of persistence for displaying the persistent image; and during each video frame of the display device: generating a frame value not greater than the variable persistence value, generating for each of the plurality of pixels a pseudorandom pixel value not greater than the variable persistence value, and for each pixel of the display device whose pseudorandom pixel value matches the frame value, making the persistence bit for the corresponding pixel in the persistence display memory have the second value.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
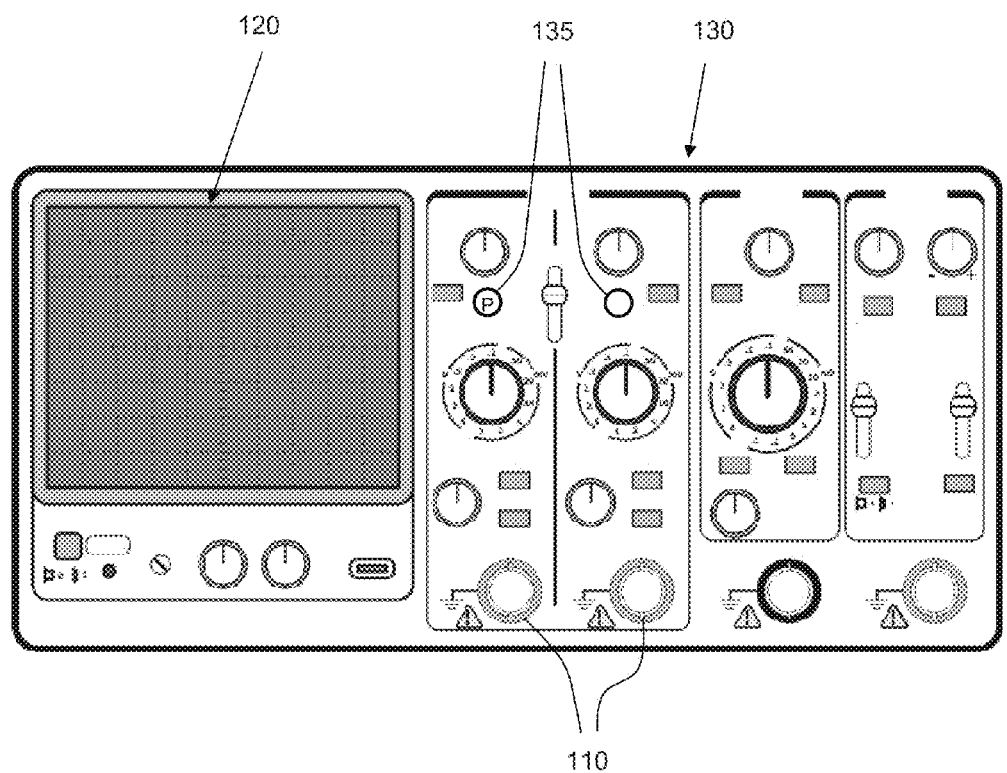
FIG. 1 illustrates an example oscilloscope with a variable persistence.
Figure 2:
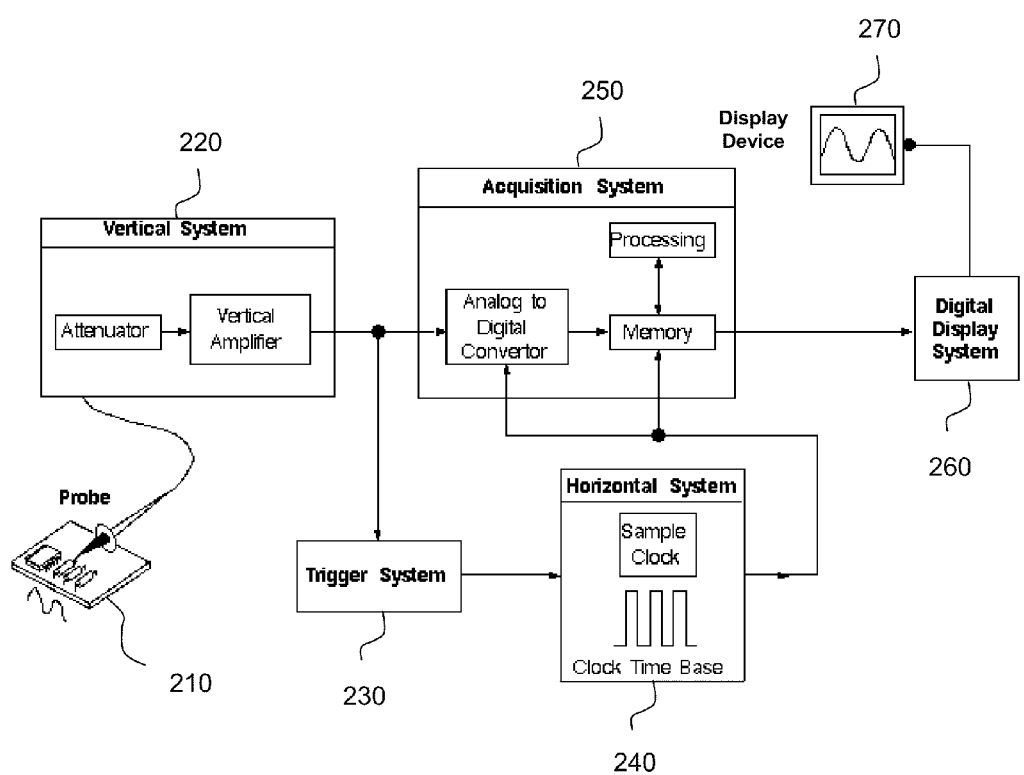
FIG. 2 shows a functional block diagram of one example of a digital oscilloscope.
Figure 3:
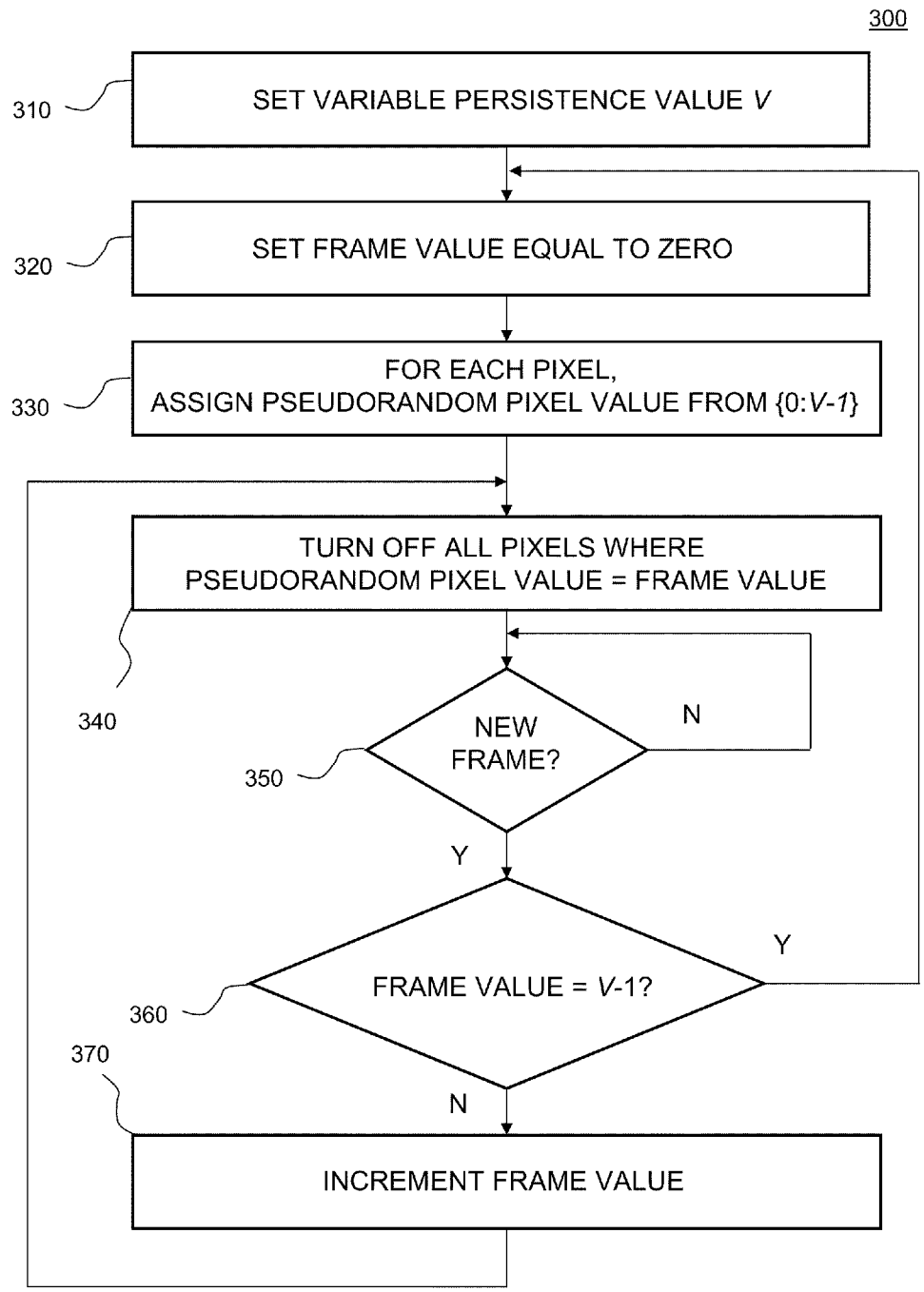
FIG. 3 shows a flowchart of one embodiment of a process for processing data to display a variably persistent image on a display device.

FIG. 3 shows a flowchart of one embodiment of a process 300 for processing data to display a variably persistent image on a display device—for example a variably persistent waveform image for a measurement instrument such as a digital oscilloscope, a logic analyzer, a digital spectrum analyzer, or other measurement instrument which displays data or measurement results on a display device.

In step 310, a variable persistence value V is selected, for example in response to a user input received via a control input of a measurement instrument, such as a digital oscilloscope. For example, a user of a measurement instrument may operate a control input of the measurement instrument to provide a user input to select a time period (e.g., five seconds) of desired persistence for the displayed data traces. In response to the user input, the measurement instrument may determine the variable persistence value V in units of video frames of the measurement instrument's display device. For example, if the user input selects three seconds of persistence, and if the display device's video frame rate is 60 frames/second, then V would be 180. In practice, the variable persistence value V can range from zero to a maximum persistence value supported by the measurement instrument. In some embodiments, the measurement instrument may also have a separate control input for allowing a user to select "infinite persistence" wherein the waveform image remains displayed permanently as long as the control input is enabled. Further details of setting the variable persistence value V will be described in greater detail below, particularly with respect to FIG. 4.

In a step 320, a frame value generator sets a frame value F to zero. As will be explained in greater detail below, the frame value F is incremented once for each video frame until it reaches a maximum frame value of V−1.

In a step 330, a pseudorandom pixel value $P_{XY}$ is assigned to each pixel (X,Y) of the display device, where X designates a row and Y designates a column of a display device. In various embodiments, the pseudorandom pixel value $P_{XY}$ may have any integer value between 0 and V−1. For example, in some embodiments a pseudorandom pixel value generator may include a pseudorandom number generator (PRNG) which is reset once per video frame, and which generates a new pseudorandom pixel value $P_{XY}$ at the pixel clock rate for each pixel (X,Y) of the display device. In some embodiments, for each displayed pixel (X,Y), the pseudorandom pixel value generator generates the exact same pseudorandom pixel value $P_{XY}$ for each video frame.

In a step 340, each pixel (X,Y) of the display device whose pseudorandom pixel value $P_{XY}$ matches or is equal to the frame value F is turned off for the persistent image that is being displayed.

In a step 350, it is determined whether a new video frame is beginning. If not, the process waits at step 350 until a new frame starts. If so, then the process proceeds to step 360 where it is determined if the frame value=V−1.

If in step 360 it is determined that the frame value does not equal V−1, then in step 370 the frame value F is incremented and the process returns to step 340 where the pixels (X, Y) whose pseudorandom pixel value P matches or is equal to the new frame value F are turned off for the persistent image that is being displayed. If in step 360 it is determined that the frame value does not equal V−1, then the process returns to step 310 where the frame value generator is reloaded and reset to zero.

Figure 4:
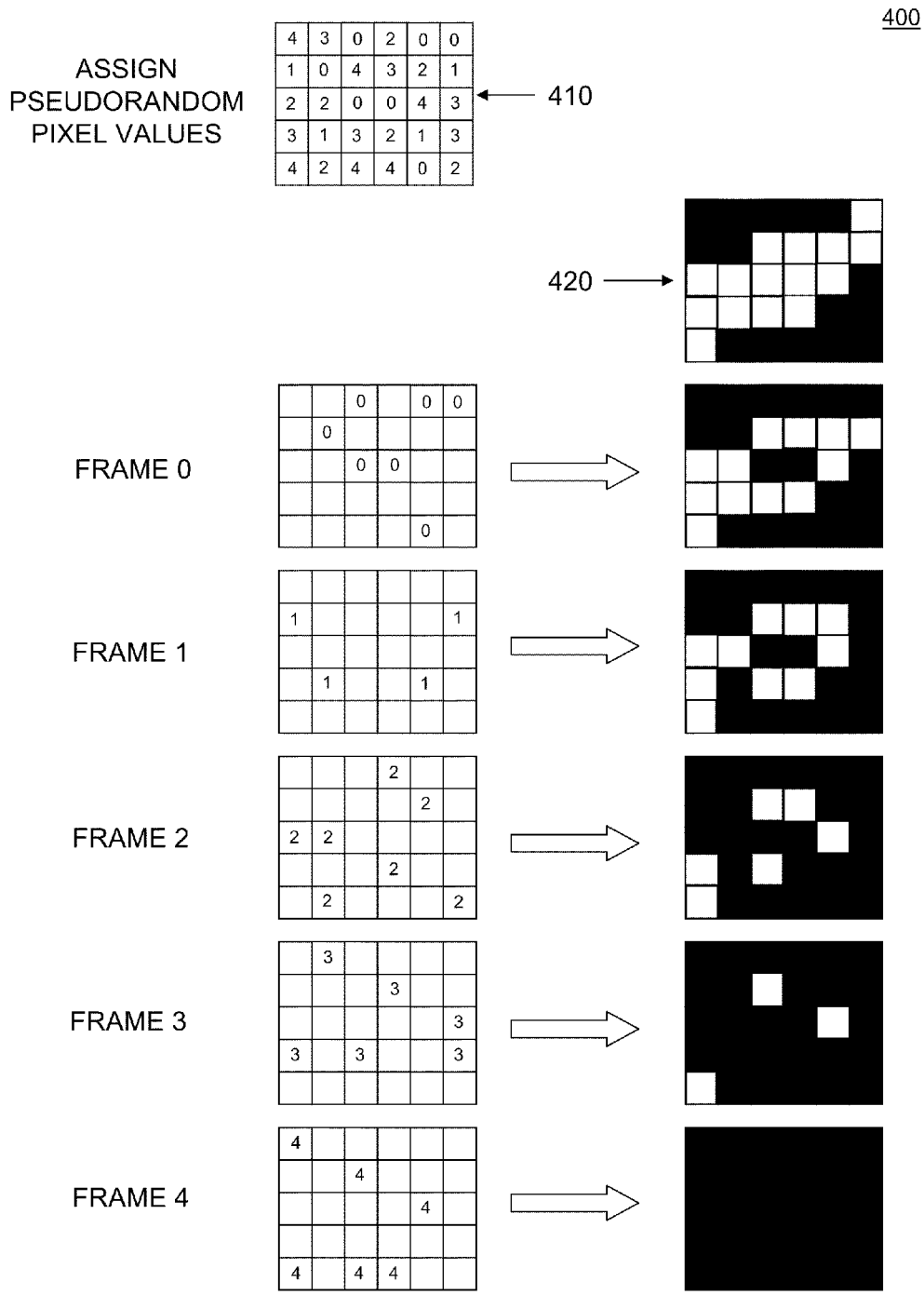
FIG. 4 illustrates one embodiment of a method of displaying a variably persistent image on a display device.

To better visualize how this works, FIG. 4 illustrates one embodiment of a method 400 of displaying a variably persistent image on a display device. FIG. 4 shows an example of a 5×6 array 410 of pseudorandom pixel values $P_{XY}$ for a display device 420 having a corresponding 5×6 array of pixels (X,Y). In the illustrated example, it is assumed that: the specified variable persistence value V is set equal to 5; a pseudorandom pixel value generator generates the pseudorandom pixel values $P_{XY}$ shown in array 410 on the top line of FIG. 4; and the persistent image to be displayed is as shown on display device 420 on the second-from-top line of FIG. 4.

As illustrated in FIG. 4, during a video frame "0", the frame value F is 0, and each pixel (X,Y) in display device 420 whose corresponding pseudorandom pixel value $P_{XY}$ in array 410 is 0 is turned off for displaying the variably persistent image in display device 420. During video frame "1", the frame value F is 1, and each pixel (X, Y) in display device 420 whose corresponding pseudorandom pixel value $P_{XY}$ in array 410 is 1 is turned off for displaying the variably persistent image in display device 420. The process continues up to video frame "4" where the frame value F is equal to V−1, at which time all of the pixels (X,Y) in display device 420 have been turned off for the variably persistent image.

It is noted that the displayed variably persistent image is erased gradually over the V=5 display frames. Also, due to the pseudorandom distribution of pseudorandom pixel values $P_{XY}$ assigned to the pixels (X, Y) in display device 420, this erasing is "spread out" across the display device 420. In the example shown in FIG. 4, $⅕^{th}$ of the pixels are erased during each video frame, and every pixel is guaranteed to be erased with V=5 frames. Such behavior may be considered to be desirable in comparison to waiting until the fifth frame and then erasing the persistent image all at once, which in contrast to the method illustrated in FIG. 4 provides no indication of the "age" of the persistent image. As shown in FIG. 4, as the number of pixels that remain turned on for the persistent image diminishes from video frame to video frame, the overall brightness of the persistent image decreases gradually so that the persistent image appears to a viewer to fade away into the background.

It should be noted that during the process 300, in general new additional live data traces could be gathered by the measurement instrument, and therefore would be added into the persistence memory. These data traces can be thought of as entering the loop in process 300 at an arbitrary frame number. That is, the loop the process 300 is continuously running or being executed, and this new traces will be cleared away with the V (e.g., 5) display frames. Advantageously, by this arrangement the system does not have to keep track of the "age" of a persistent image and therefore does not require an expensive memory to hold or store this age. As a result, a one-bit-per-pixel persistence display memory can be employed which holds data that would always be a mixture of traces of varying ages at any given time.

Figure 5:
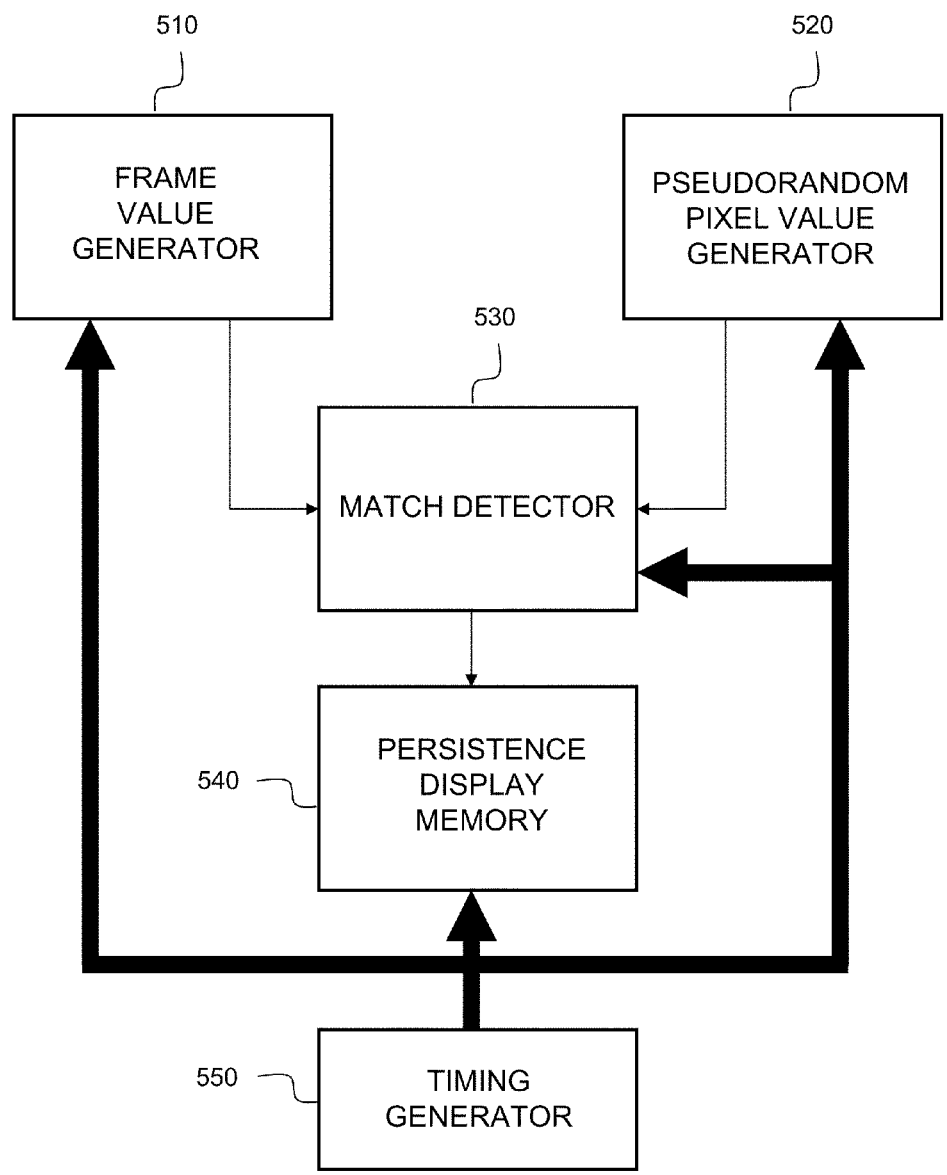
FIG. 5 shows a high level functional block diagram of one embodiment of a device for processing data to display a variably persistent image on a display device.

FIG. 5 shows a high level functional block diagram of one embodiment of a device 500 for processing data to display a variably persistent image on a display device—for example a variably persistent waveform image generated by a measurement instrument. Device 500 includes a frame value generator 510, a pseudorandom pixel value generator 520, a match detector 530, a memory 540 (hereinafter referred to as persistence display memory 540), and a timing generator 550.

In operation, persistence display memory 540 stores a persistence bit for each pixel of a display device, the persistence bit having a first value (e.g., "1") when a corresponding pixel in the display device should be illuminated for a persistent image representing a measurement by the measurement instrument, and having a second value (e.g., "0") when the corresponding pixel should not be illuminated for the persistent image.

Frame value generator 510 generates a frame value F for each video frame. The frame value F may assume any value from 0 to V−1, where V is a variable persistence value representing a number of video frames of persistence for displaying the persistent image on the display device corresponding to a desired persistence of the persistent image, which may be a persistence selected by a user via a control input of the measurement instrument. In one embodiment frame value generator 510 may comprise an N-bit counter which is loaded with variable persistence value V and is incremented once per video frame. In that case, N is selected to support the maximum allowable variable persistence for the device 500. For example, using an N=10 bit counter, and a video frame rate of 60 frames/second, frame value generator 510 can support $2^{10}/60=17$ seconds of maximum variable persistence. For example, if a user input indicates a desired persistence of two seconds for the persistent image, then V would be set equal to 2*60=120 and in response to a timing signal (e.g., a vertical sync signal) from timing generator 550, the N-bit counter of frame value generator 510 would count up from 0 to 119 (or alternatively, count down from 119 to 0).

Pseudorandom pixel value generator 520 receives a seed value for each video frame of the display device and in response thereto generates a pseudorandom pixel value $P_{XY}$ for each pixel (X, Y) of the display device during each video frame. In one embodiment, in response to a timing signal (e.g., a vertical sync signal) from timing generator 550, pseudorandom pixel value generator 520 is reloaded with the same seed value for each video frame of the display device. In that case, for each pixel (X, Y) of the display device pseudorandom pixel value generator 520 generates the same pseudorandom pixel value $P_{XY}$ for every video frame. Each pseudorandom pixel value $P_{XY}$ is less than the specified variable persistence value V.

During each video frame, match detector 530 compares the frame value F to the pseudorandom pixel value $P_{XY}$ for each pixel (X, Y), and for each pixel (X, Y) where the comparison indicates a match, match detector 530 generates an output which makes the persistence bit for the corresponding pixel (X, Y) in persistence display memory 540 have the value (e.g., the second value or "0") that indicates that the corresponding pixel in the display device should not be illuminated for the persistent image. As timing generator 550 causes frame value generator 510 to generate a new frame value F for each video frame, the match detection is repeated each video frame and produces a different result in each video frame for each pixel (X, Y) of the display device, gradually turning off all of the pixels for the persistent image and thereby erasing the persistent image.

Figure 6:
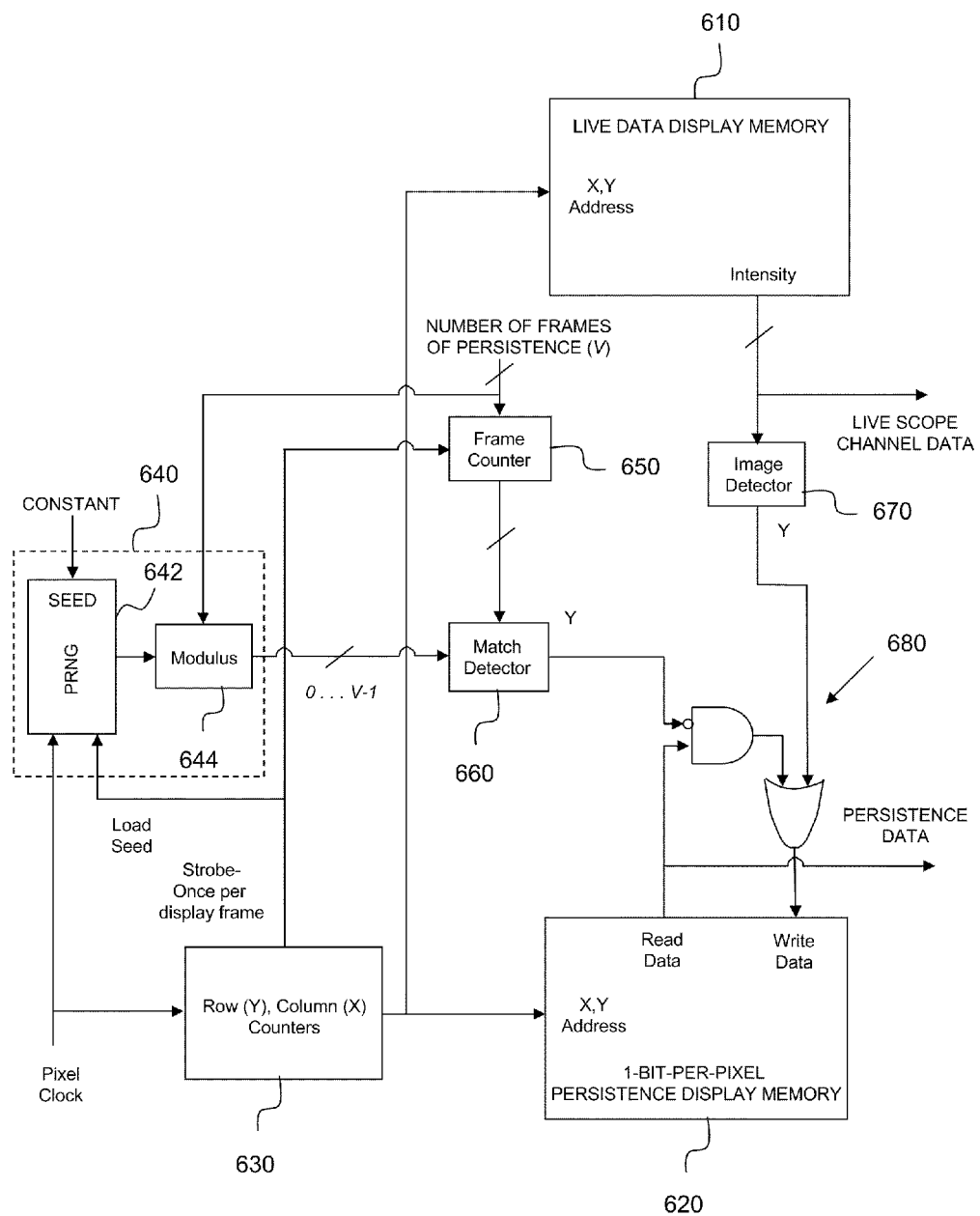
FIG. 6 shows a detailed block diagram of one embodiment of a device for processing data to display a variably persistent image on a display device.

FIG. 6 shows a detailed block diagram of a device 600 for processing data to display a variably persistent image on a display device. Device 600 includes: a memory 610 (hereinafter referred to as live data display memory 610), a memory 620 (hereinafter referred to as one-bit-per-pixel persistence display memory 620), one or more row/column counters 630, a pseudorandom pixel value generator 640, a counter 650 (hereinafter referred to as frame counter 650), a match detector 660, an image detector 670, and logic circuits 680. Pseudorandom pixel value generator 640 includes a pseudorandom number generator (PRNG) 642 and a modulus unit 644. In one embodiment, PRNG 642 may comprise a P-bit shift register with an exclusive NOR gate providing feedback from the register outputs to its input.

Live data display memory 610 and one-bit-per-pixel persistence display memory 620 each include one memory location corresponding to one of the pixels of a display device on which the variably persistent image is to be displayed. In general, live data display memory 610 stores many bits for each pixel, for example representing an intensity and/or color with which a corresponding pixel is to be illuminated. In a beneficial feature, one-bit-per-pixel persistence display memory 620 stores exactly one persistence bit for each pixel of the display device. The persistence bit has a first value (e.g., "1") when a corresponding pixel in the display device should be illuminated for a persistent image representing a measurement by the measurement instrument, and has a second value (e.g., "0") when the corresponding pixel should not be illuminated for the persistent image.

In operation, row/column counters 630 receives a pixel clock and in response thereto during each video frame sequentially outputs row and column addresses corresponding to a full scan of the display device. The row and column addresses are provided to live data display memory 610 and one-bit-per-pixel persistence display memory 620 to thereby sequentially scan the memory locations corresponding to the pixels of the display device. Row/column counters 630 also outputs a video frame synchronization signal (e.g., a vertical sync VSYNC) that includes an indication (e.g., a pulse or strobe) of each new video frame.

As each memory location of live data display memory 610 corresponding to each pixel of the display device is accessed in response to row/column counters 630, image detector 670 detects whether or not the pixel is illuminated and if so, sets a corresponding one-bit-per-pixel persistence display memory 620 to have the first value (e.g., "1") thereby indicating that the corresponding pixel in the display device should be illuminated for a persistent image representing a measurement by the measurement instrument.

Frame counter 650 is loaded with the persistence value V representing a number of video frames of persistence for displaying the persistent image on the display device corresponding to a desired persistence of the persistent image, which may be a persistence selected by a user via a control input of the measurement instrument. In response to the video frame synchronization signal from row/column counters 630, the counter is incremented (or in an alternative embodiment is decremented) to generate a frame value F from 0 to V−1 for each video frame.

Pseudorandom pixel value generator 640 receives a constant seed value that is reloaded for each video frame of the display device in response to the video frame synchronization signal from row/column counters 630. In response thereto, pseudorandom pixel value generator 640 generates a pseudorandom pixel value $P_{XY}$ for each pixel (X, Y) of the display device during each video frame in response to a timing signal (e.g., a vertical sync signal) from row/column counters 630. In particular, in response to the pixel clock PRNG 642 generates a new pseudorandom number once for each pixel period. Modulus unit 644 receives the specified variable persistence value V and in response thereto converts the pseudorandom number from PRNG 642 into a corresponding pseudorandom pixel value $P_{XY}$. Each pseudorandom pixel value $P_{XY}$ is an integer that is less than the specified variable persistence value V. Because pseudorandom pixel value generator 640 is reloaded with the same seed value for each video frame of the display device, for each pixel (X, Y) of the display device pseudorandom pixel value generator 640 generates the same pseudorandom pixel value $P_{XY}$ for every video frame.

During each video frame, match detector 660 compares the frame value F to the pseudorandom pixel value $P_{XY}$ for each pixel (X, Y), and for each pixel (X, Y) where the comparison indicates a match, match detector 660 supplies an output signal to logic circuits 680 to cause the persistence bit for the corresponding pixel (X, Y) in one-bit-per-pixel persistence display memory 620 have the value (e.g., the second value or "0") that indicates that the corresponding pixel in the display device should not be illuminated for the persistent image. As row/column counters 630 cause frame counter 650 to increment (or decrement) frame value F by one for each video frame, the match detection is repeated each video frame and produces a different result in each video frame for each pixel (X, Y) of the display device, gradually causing all of the persistence bits in one-bit-per-pixel persistence display memory 620 to have the value (e.g., the second value or "0") that indicates that the corresponding pixel in the display device should not be illuminated for the persistent image, thereby erasing the persistent image.

In various embodiments, device 600 may be part of a digital oscilloscope, a logic analyzer, a digital spectrum analyzer, or other measurement instrument which displays data or measurement results on a display device. In a beneficial feature, when an instrument includes a plurality of channels (e.g., two channels or four channels) for which data is to be measured and a variably persistent image is to be displayed, many of the components of device 600 may be shared among the multiple channels, including for example row/column counters 630, pseudorandom pixel value generator 640, frame counter 650, match detector 660, and image detector 670. Modifying device 600 to support multiple channels requires the addition of additional one-bit-per-pixel persistence display memories 620 for each additional channel.

In the examples described above with respect to FIGS. 3, 4 and 6 in particular, embodiments were described where the frame value is strictly incremented (or decremented) with every frame, e.g. a sequence of (0, 1, 2, 3 . . . V−2, V−1, 0, 1, 2, 3, 4, . . . ). This guarantees that the lifetime of each pixel for the persistent image is no greater than V frames. However in an alternative embodiment, a pseudorandom frame value from {0: V−1} maybe selected for each video frame, e.g. a sequence of (7, V−1, 5, 1, 3, V−3, 0, 3, . . . ). In that case, the lifetime of each pixel of the display device for the persistent image is variable and potentially much longer than in the "fixed" case.

Also, in the examples described above with respect to FIGS. 3, 4 and 6 in particular, embodiments were described where the pseudorandom pixel values were fixed for every frame for a given persistence value V because the pseudorandom pixel value generator was reloaded with the same seed value for every frame. However in an alternative embodiment, the pseudorandom pixel value generator may be reloaded with a different seed value each time that the frame counter is reset to zero (i.e., for each set of V video frames). In that case, all of the pixels of the persistent image would fade away with one spatial pattern during one set of V video frames, and would fade away with a different spatial pattern during another set of V video frames.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A device, comprising:
a memory configured to store a persistence bit for each of a plurality of pixels of a display device, the persistence bit having a first value when a corresponding pixel should be illuminated for displaying a persistent image, and having a second value when the corresponding pixel should not be illuminated for the persistent image;
a pseudorandom pixel value generator configured to receive a seed value for each video frame of the display device and in response thereto to generate pseudorandom pixel values for the plurality of pixels during each video frame, each pseudorandom pixel value being not greater than a specified variable persistence value corresponding to a desired persistence time for the persistent image, wherein each pixel of the display device, which has a pseudorandom pixel value that matches or is equal to a frame value, is turned off for the persistent image that is being displayed;
a frame value generator configured to output a frame value for each video frame of the display device, each frame value being not greater than the specified variable persistence value; and
a match detector configured to compare the frame value to the pseudorandom pixel values for the plurality of pixels during each video frame, and for each pixel where the comparison indicates a match, to make the persistence bit for the corresponding pixel have the second value.

2. The device of claim 1, wherein the specified variable persistence value is a number of video frames equal to the desired persistence of the persistent image.

3. The device of claim 1, wherein the pseudorandom pixel value generator comprises:
a pseudorandom number generator configured to receive the seed value and in response thereto to output a pseudorandom value; and
a modulus unit configured to receive the pseudorandom value and the specified variable persistence value and in response thereto to output the pseudorandom pixel values each being an integer not greater than the specified variable persistence value.

4. The device of claim 1, wherein the frame value generator comprises a counter configured to be loaded with the specified variable persistence value and to count up or down once for each video frame.

5. The device of claim 4, wherein the pseudorandom pixel value generator is configured to receive a different seed value each time the counter resets.

6. The device of claim 1, wherein the pseudorandom pixel value generator is configured to receive the same seed value for each video frame.

7. The device of claim 1, further comprising a second memory storing a second persistence bit for each of the plurality of pixels, the second persistence bit having the first value when a corresponding pixel should be illuminated for displaying a second persistent image, and having a second value when the corresponding pixel should not be illuminated for the second persistent image,
wherein the match detector is further configured, for each pixel where the comparison indicates a match, to make the second persistence bit for the corresponding pixel in the second memory have the second value.

8. The device of claim 1, comprising a measurement instrument, including:
the display device;
at least one input for receiving at least one signal to be represented on the display device; and
a variable persistence control input configured to receive a user input specifying the variable persistence value corresponding to a desired persistence time for displaying the persistent image.

9. The device of claim 8, further comprising a second memory for storing data representing the received signal and to be displayed on the display device.

10. The device of claim 1, wherein the memory stores exactly one persistence bit for each pixel of the display device.

11. A method, comprising:
storing in a memory a persistence bit for each of a plurality of pixels of a display device, the persistence bit having a first value when a corresponding pixel should be illuminated for displaying a persistent image, and having a second value when the corresponding pixel should not be illuminated for the persistent image;
establishing a variable persistence value representing a number of video frames of persistence for displaying the persistent image; and
during each video frame of the display device:
generating a frame value not greater than the variable persistence value,
generating for each of the plurality of pixels a pseudorandom pixel value not greater than the variable persistence value, and
for each pixel whose pseudorandom pixel value matches the frame value, making the persistence bit for the corresponding pixel have the second value, wherein each pixel of the display device which has the pseudorandom pixel value that matches or is equal to the frame value is turned off for the persistent image that is being displayed.

12. The method of claim 11, wherein the specified variable persistence value is a number of video frames equal to the desired persistence of the persistent image.

13. The method of claim 11, wherein generating the pseudorandom pixel value comprises:
generating a pseudorandom value in response to the seed value; and
in response to the pseudorandom value and the specified variable persistence value, outputting the pseudorandom pixel values each being an integer not greater than the specified variable persistence value.

14. The method of claim 11, wherein generating the frame value comprises:
loading a counter with the specified variable persistence value; and
counting up or down once for each video frame.

15. The method of claim 14, wherein the pseudorandom pixel value generator is configured to receive a different seed value each time the counter resets.

16. The method of claim 11, wherein the pseudorandom pixel value generator is configured to receive the same seed value for each video frame.

17. The method of claim 11, further comprising:
storing in a second memory a second persistence bit for each of the plurality of pixels, the second persistence bit having the first value when a corresponding pixel should be illuminated for a second persistent image, and having a second value when the corresponding pixel should not be illuminated for the second persistent image; and
during each video frame of the display device, for each pixel whose pseudorandom pixel value matches the frame value, making the second persistence bit for the corresponding pixel have the second value.

18. The method of claim 11, further comprising receiving a user input specifying the variable persistence value corresponding to the desired persistence time for the persistent image.

19. The method of claim 18, further comprising:
receiving at least one signal;
storing in a second memory data representing the received signal;
displaying on the display device a representation of the at least one signal produced by the data in the second memory.

20. The method of claim 11, wherein storing in a memory a persistence bit for each of a plurality of pixels of a display device comprises storing in the memory exactly one persistence bit for each pixel of the display device.

* * * * *